United States Patent
Wong et al.

(10) Patent No.: US 6,407,591 B1
(45) Date of Patent: Jun. 18, 2002

(54) SELF-CONFIGURABLE CLOCK INPUT BUFFER COMPATIBLE WITH HIGH-VOLTAGE SINGLE-ENDED AND LOW-VOLTAGE DIFFERENTIAL CLOCK SIGNALS

(75) Inventors: Keng L. Wong; Hung-Piao Ma, both of Portland; Songmin Kim, Beaverton; Chi-Yeu Chao, Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/608,238

(22) Filed: Jun. 30, 2000

(51) Int. Cl.[7] .................................................. H03K 5/22
(52) U.S. Cl. .......................... 327/63; 327/291; 327/294

(58) Field of Search .............................. 327/63, 65, 67, 327/68, 77, 81, 85, 87, 89, 560, 563, 291, 294, 299, 379

(56) References Cited

U.S. PATENT DOCUMENTS 4,241,372 A * 12/1980 Sears ........................... 361/72
6,014,054 A * 1/2000 Kawakita et al. ............ 327/563
6,087,893 A * 7/2000 Oowaki et al. .............. 327/537

* cited by examiner

Primary Examiner—Tuan T. Lam
(74) Attorney, Agent, or Firm—Blakely, Sokoloff, Taylor & Zafman LLP

(57) ABSTRACT

A dual mode clock input buffer is disclosed. The input buffer includes a first portion for handling a single ended high voltage clock signal and a second portion for handling a differential low voltage clock signal.

15 Claims, 4 Drawing Sheets

US 6,407,591 B1

SELF-CONFIGURABLE CLOCK INPUT BUFFER COMPATIBLE WITH HIGH-VOLTAGE SINGLE-ENDED AND LOW-VOLTAGE DIFFERENTIAL CLOCK SIGNALS

TECHNICAL FIELD OF THE INVENTION

The present invention relates to clock input buffers, and more particularly, to a clock input buffer that can automatically configure itself to receive high-voltage single-ended and low-voltage differential clock signals.

BACKGROUND OF THE INVENTION

As integrated circuit transistors have shrunk in size, the thickness of the gate oxide used in the transistor has also decreased. In some advanced transistors, the thickness of the gate oxide is less than 50 angstroms. With a thin gate oxide, it is difficult for the transistor to accept high-voltage inputs. One common type of high-voltage input is a high-voltage single-ended clock signal. To ease the high-voltage problem, the trend is to use a low-voltage differential clock signal. This relaxes the amount of stress on the gate oxide for these new semiconductor devices.

However, there is still a demand for newer integrated circuits to be compatible with older integrated circuits that use a high-voltage single-ended clock signal. In other words, components that utilize these thin gate oxide semiconductor devices must nevertheless be able to handle both the low-voltage differential clock inputs and high-voltage single-ended clock inputs.

DETAILED DESCRIPTION

Figure 1:
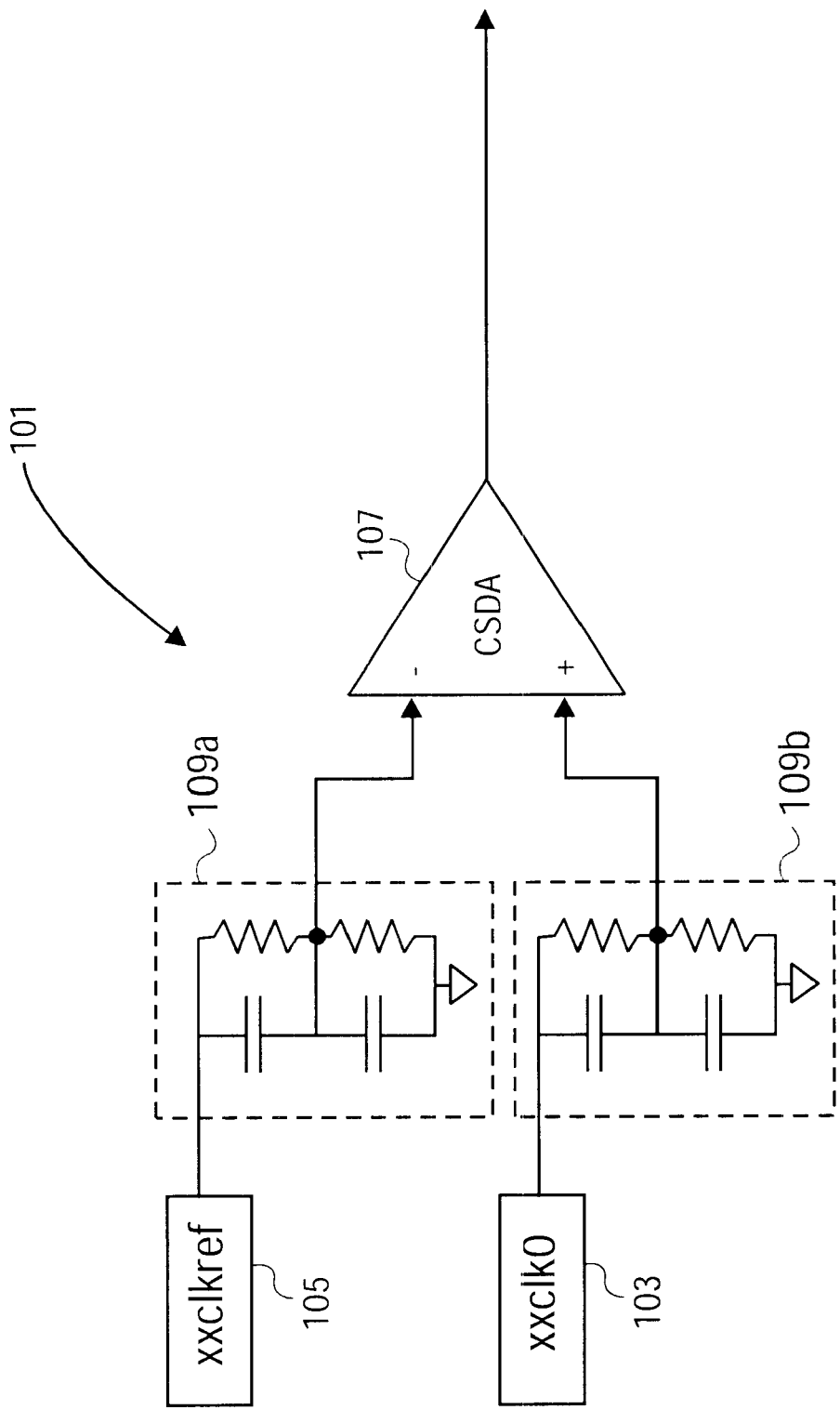
FIG. 1 is a schematic diagram of a prior art high-voltage single-ended clock input buffer.

FIG. 1 shows a prior art high-voltage single ended clock input buffer 101. The signal XXCLK0 103 is the primary clock input and the XXCLKREF 105 is the reference voltage input. The reference voltage input is DC in the single-ended case. Both XXCLK0 103 and XXCLKREF 105 are input into a complementary self-biased differential amplifier (CSDA) 107. Note that the CSDA 107 can be replaced by a conventional differential amplifier. However, a CSDA is preferred for better performance with the self-biasing property of a CSDA giving a wider operational range and higher gain. Typically, the magnitude of the high-voltage single ended signal XXCLK0 103 is 2.5 volts.

RC voltage dividers 109a and 109b are provided between the input to the CSDA 107 and XXCLK0 103 and XXCLKREF 105 to protect the gate oxide of the transistors used in the CSDA 107 from being directly exposed to the high-voltage inputs XXCLK0 103 and XXCLKREF 105. The two capacitors in series divide the input voltage to half of its voltage and the two resistors set the DC bias point of the inputs to the CSDA 107. The output voltage swing from the RC dividers is determined by the two capacitors' ratio and in this case is ¼ of the input voltage. Note that both up and down swing is ¼ of the input voltage. Thus, the output of the RC voltage dividers 109a and 109b varies between $V_{ss}$ (typically ground) and ½ of the input voltage. The purpose of the resistor divider is for setting up the DC voltage.

The RC time constant for the RC voltage dividers 109a and 109b is designed to be much greater than the input clock period. Thus, after a few clock cycles, a stabilized voltage appears between the two resistors. Although the clock input buffer 101 in FIG. 1 is acceptable for high-voltage single-ended clock inputs, the clock input buffer 101 cannot be used for low-voltage differential clock signals. This is because the voltage level of a low voltage differential clock signal is typically between 0.7 and 1.0 volts. If this signal were input into the RC voltage dividers 109a and 109b, the voltage level becomes 0.35 to 0.5 volts, which is out of the range of the CSDA 107.

Figure 2:
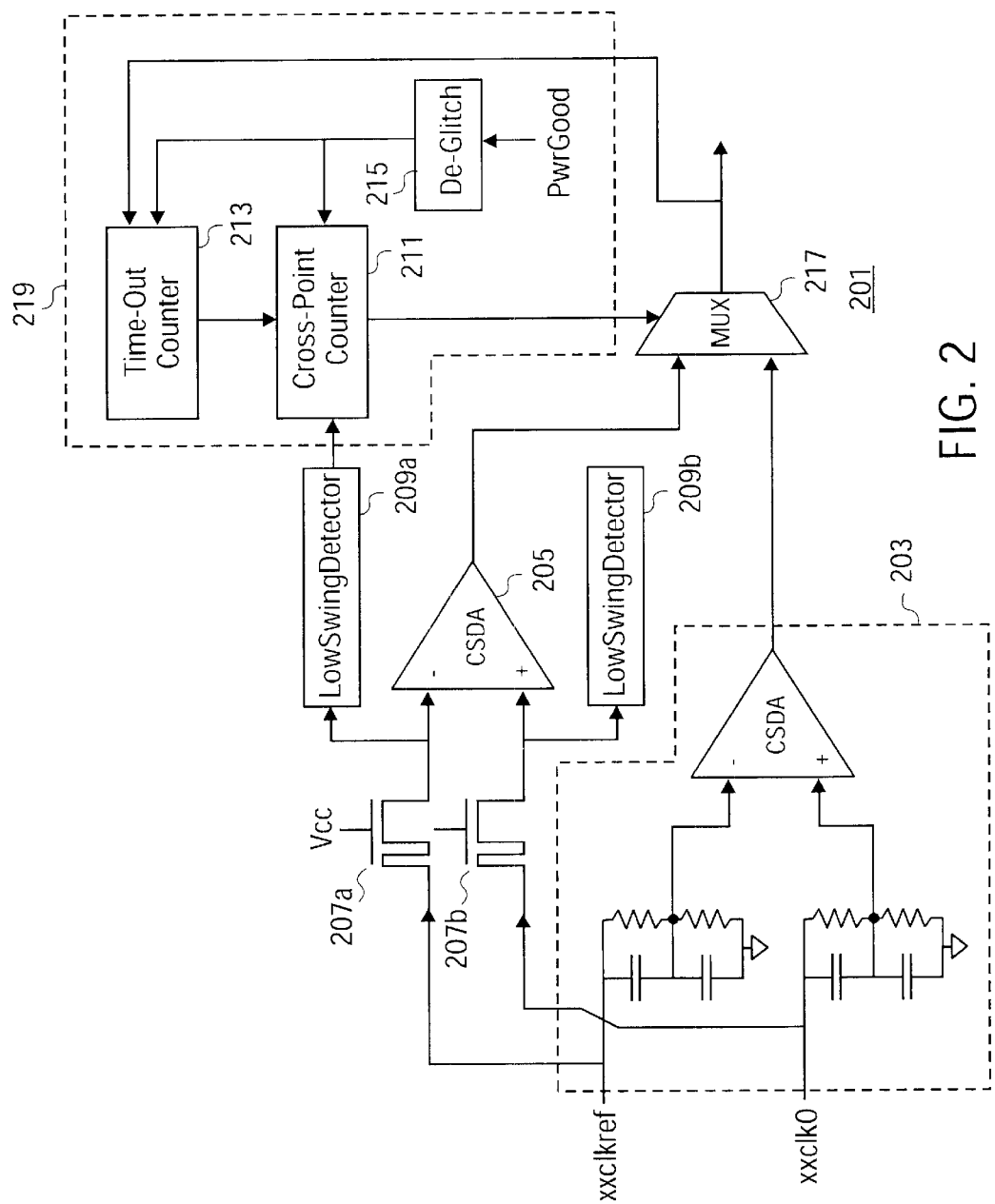
FIG. 2 is a schematic diagram of a clock input buffer formed in accordance with the present invention.

FIG. 2 shows a dual-mode clock buffer 201 formed in accordance with the present invention. Note that the inputs to the dual-mode clock buffer 201 are the same signals XXCLKREF and XXCLK0 as in FIG. 1. In addition to a high-voltage single-ended clock signal path 203, the buffer 201 also includes a second circuit portion. Note that the single-ended clock signal path 203 is substantially the same as that shown in FIG. 1.

The second circuit portion includes a second CSDA 205, VDNMOSs 207a and 207b, and low swing detectors 209a and 209b. Also included is a cross point counter 211, a time out counter 213, a de-glitch circuit 215, and a multiplexer 217.

The signal XXCLKREF is input into VDNMOS 207a and the signal XXCLK0 is input into VDNMOS 207b. As noted above, in the case of a single ended high voltage signal, the signal XXCLKREF is DC. However, in the case of a low voltage differential clock, the signal XXCLKREF is a time-varying periodic signal.

The VDNMOSs 207a and 207b are high-voltage devices, which prevents the thin gate oxide of the transistors of the second CSDA 205 from being exposed to high-voltage inputs. A VDNMOS is a special type of nMOS transistor also known as a high voltage compatible CMOS transistor. These types of transistors are well known in the art. The drain of the VDNMOS can be safely connected to a relatively high voltage. In this case, a high voltage is any voltage that is substantially higher than $V_{cc}$. However, the source of the VDNMOS cannot be exposed to a high voltage and the source can only be safely connected to a signal only up to $V_{cc}$. Although in the preferred embodiment, VDNMOSs are used, any type of device that has the equivalent functionality may be utilized.

When the input voltage at the drain of the VDNMOSs 207a and 207b are higher than the gate voltage (tied to the power supply $V_{CC}$), then the VDNMOS is operative to output a voltage at the source of the VDNMOS that is clamped to $V_{CC}-V_T$, where $V_T$ is the threshold voltage of the VDNMOS. Thus, when the input signals are a single-ended high voltage input, such as XXCLKREF and XXCLK0, the VDNMOSs 207a and 207b protect the second CSDA 205 from the high voltages. Instead, in such a case, the input to the second CSDA 205 will be $V_{CC}-V_T$.

However, when the input voltages to the VDNMOSs 207a and 207b are a low voltage differential clock, the VDNMOS devices function as a simple pass gate, which does not change the voltage swing of the signal. The term voltage swing means the voltage range of a signal. For instance, a signal that can vary between 0 volts and 1 volts is said to have a voltage swing of 1 volt. In other words, if the input voltages are a low voltage differential clock, the VDNMOSs 207a and 207b allow the low voltage differential clock signal to be input into the CSDA 205 without change. However, if a single-ended high voltage input is provided, the VDNMOSs 207a and 207b will output to the CSDA 205 a voltage $V_{CC}-V_T$.

As seen in FIG. 1, the output of the VDNMOS 207a is provided to the inverting input of the CSDA 205. The output of the VDNMOS 207b is provided to the non-inverting input of the CSDA 205. Moreover, the output of the VDNMOS 207a is also provided to low swing detector 207a and the output of the VDNMOS 207b is also provided to low swing detector 207b.

Normally, the high-voltage single ended clock portion 203 is the default input path. However, if the low-voltage swing detector 209a (which is connected to the XXCLKREF signal) detects a low-voltage swing clock toggling at XXCLKREF, it sends a full-scale swing ($V_{SS}$ to $V_{CC}$) clock to the cross point counter 211. The low swing detectors are operative to convert a low-voltage swing into a full voltage swing. In other words, when a low-voltage swing from 0 volt to 1 volt (and vice versa) is detected on the outputs of either VDNMOS 207a or 207b, then the associated low swing detector 209a will generate an output signal that swings from 0 volts to $V_{cc}$ and vice versa. A low-voltage swing is, for example, when a differential clock input is provided.

Note that the low swing detector 209b does not have an output. The primary purpose of the low swing detector 209b is for load balancing.

Specifically, the low swing detector 209b is to present the signal XXCLK0 with the same capacitive load as for XXCLKREF. Thus, XXCLK0 and XXCLKREF will have the same amount of load. This results in the clock delay from XXCLKREF and XXCLK0 to be the same when propagating to the CSDA 205.

As noted above, the output of low swing detector 209a is provided to cross-point counter 211. The cross-point counter 211 is a four-bit counter that is used to count the number of clocks from the low swing detector 209a. Thus, when cross point counter 211 receives 16 full swing clock signals from low swing detector 209a, it sets the multiplexer 217 to select the input clock from the differential path, i.e., the output of the second CSDA 205. The fact that cross point counter 211 counts to 16 before triggering is arbitrary and any number can be used. However, it has been found that 16 clock swings best eliminates false positives while maintaining self configurability within a reasonable amount of time.

The multiplexer 217 receives signals from the single-ended portion 203 and from the CSDA 205. Normally, the multiplexer 217 will pass on the signal from the single-ended portion 203. However, if cross point counter 211 sends the appropriate signal to multiplexer 217, the multiplexer 217 will pass on the signal output from the CSDA 205.

Additionally, the time out counter 213 is used to control the cross-point counter 211. Specifically, time out counter 213 is designed to stop the cross point counter 211 from repeatedly resetting the multiplexer 217 by disabling the cross point counter 211 from counting after 256 clock cycles. The time out counter 213 prevents the cross point counter 211 from inadvertently triggering differential clock mode due to noise when the input clock is in actuality a single-ended high voltage signal. In other words, it is possible that noise on the XXCLKREF signal is large enough to trigger low swing detector 209a from time to time. If the noise triggers the low swing detector 209b 16 times, the cross point counter 211 will incorrectly switch from single-ended to differential mode. To prevent this occurrence, the time out counter 211 disables the cross point counter 211 after it receives 256 clocks.

The time out counter 213 and the cross point counter 211 are reset by the de-glitch circuit 215. Further, the time out counter 213 is triggered by the output of the multiplexer 217. Preferably, the time out counter 213 is an eight bit counter. The de-glitch circuit 215 resets the time out counter 213 and the cross point counter 211 after the PWRGOOD signal is asserted. The PWRGOOD signal is a power on indicator and is asserted after $V_{cc}$ ramps up from 0 volts and reaches the specified voltage. The combination of the cross point counter 211, the time out counter 213, and the de-glitch circuit 215 are collectively known as a controller 219. The controller 219 serves to monitor the low swing detector 209a for the presence of a low voltage differential clock, and if present, direct the multiplexer 217 to select the output from the CSDA 205.

Even though the circuit of the present invention is self configurable as explained above, it can be appreciated that the apparatus 201 may also use fuse options that allows either single ended only or differential only operation.

Figure 3:
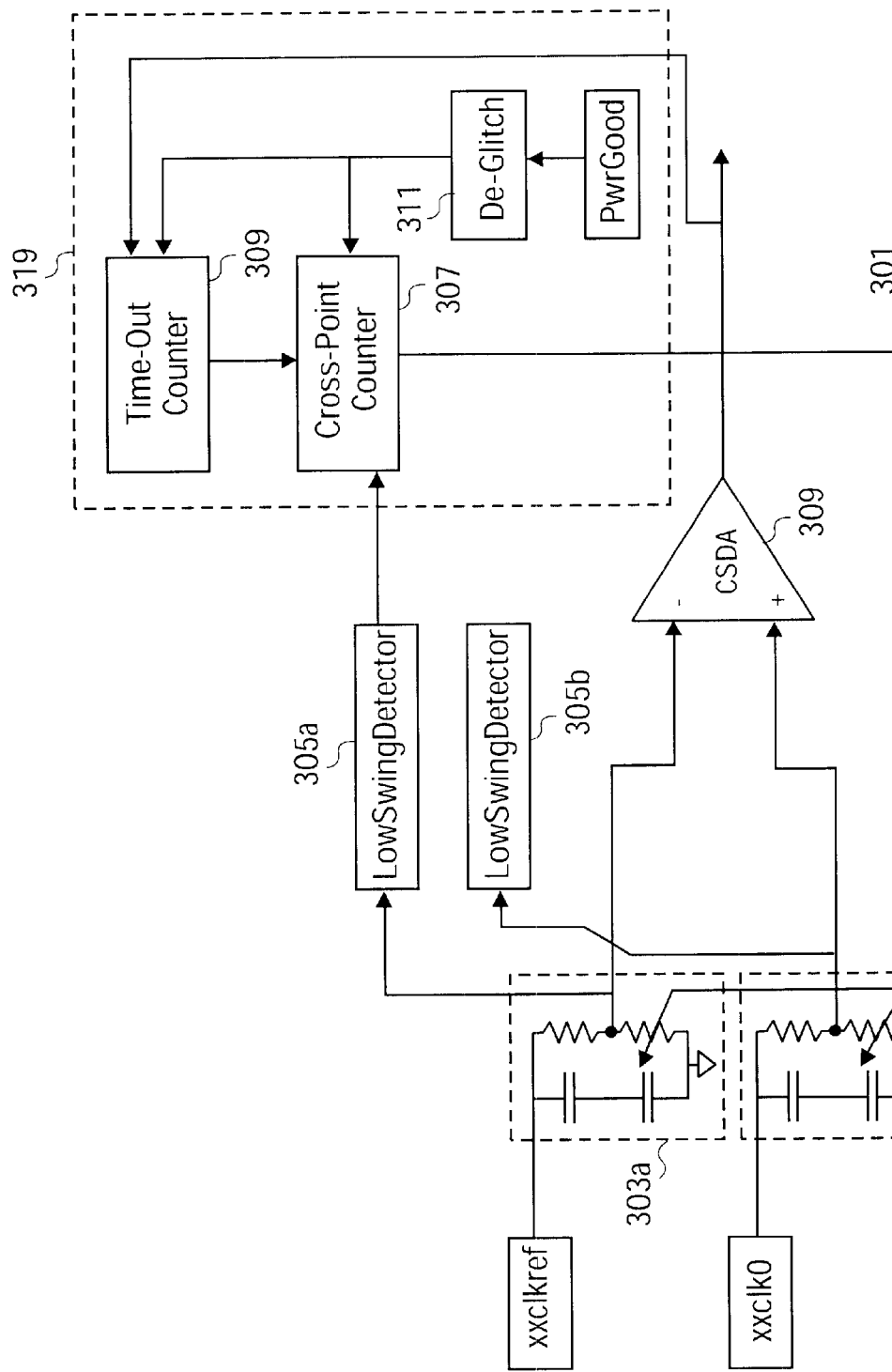
FIG. 3 is a schematic diagram of a clock input buffer formed in accordance with an alternative embodiment of the present invention.

FIG. 3 shows an alternative embodiment of a dual mode clock input buffer 301. This embodiment uses a variable RC voltage divider technique. The input signals XXCLKREF and XXCLK0 are input into variable RC voltage dividers 303a and 303b, respectively. The output of the variable RC voltage dividers 303a and 303b are input to low-voltage swing detectors 305a and 305b, respectively. Additionally, the output of the variable RC voltage dividers 303a and 303b are also input into a CSDA 309.

The variable RC voltage dividers 303a and 303b are circuits that can be controlled to adjust their output voltage by either connecting or disconnecting resistive elements. It can be appreciated that other circuits may accomplish a similar function. As noted above with respect to FIG. 1, the node between the resistors will provide a voltage of one half of the input voltage if the resistor values are equal. If, however, the bottom resistor is removed, the voltage at the output node will be equal to the input voltage. It is this principle that is used to configure the circuit of the present invention.

The output of the low swing detector 305a is input into the cross point counter 307. The cross-point counter 307 is a four-bit counter that is used to count the number of clocks from the low swing detector 305a. Thus, when cross point counter 307 receives 16 full swing clock signals from low swing detector 305a, the cross point counter 307 will output a signal to the RC voltage dividers 303a and 303b to disable the bottom resistors of the RC voltage dividers 303a and 303b.

Like the embodiment of FIG. 2, the low swing detector 305b is primarily for load balancing purposes. Further, like the embodiment of FIG. 2, time out counter 309 is designed to stop the cross point counter 307 from inadvertently triggering differential clock mode due to noise when the input clock is in actuality a single-ended high voltage signal. In other words, it is possible that noise on the XXCLKREF signal is large enough to trigger low swing detector 305a from time to time. If the noise triggers the low swing detector 305b 16 times, the cross point counter 307 will incorrectly switch from single-ended to differential mode. To prevent this occurrence, the time out counter 309 disables the cross point counter 307 after it receives 256 clocks.

The de-glitch circuit 311 resets the time out counter 309 and the cross point counter 307 after a PWRGOOD signal is asserted. The PWRGOOD signal is a power on indicator and is asserted after $V_{cc}$ ramps up from 0 volts and reaches the specified voltage. The combination of the cross point counter 307, the time out counter 309, and the de-glitch circuit 311 are collectively known as controller 319. The controller 319 serves to monitor the low swing detector 305a for the presence of a low voltage differential clock, and if present, direct the RC voltage dividers 303a and 303b to disable a resistor.

Even though the circuit of FIG. 3 is self configurable as explained above, it can be appreciated that the apparatus 301 may also use fuse options that allows either single ended only or differential only operation.

The default-input path is high-voltage single ended, e.g., both resistors of the RC voltage dividers 303a and 303b are initially "turned on." When the resistors are fully turned on, the voltage swing for a differential clock input, as well as the DC bias point at the inputs to the CSDA 309 will be halved for all clock inputs.

Figure 4:
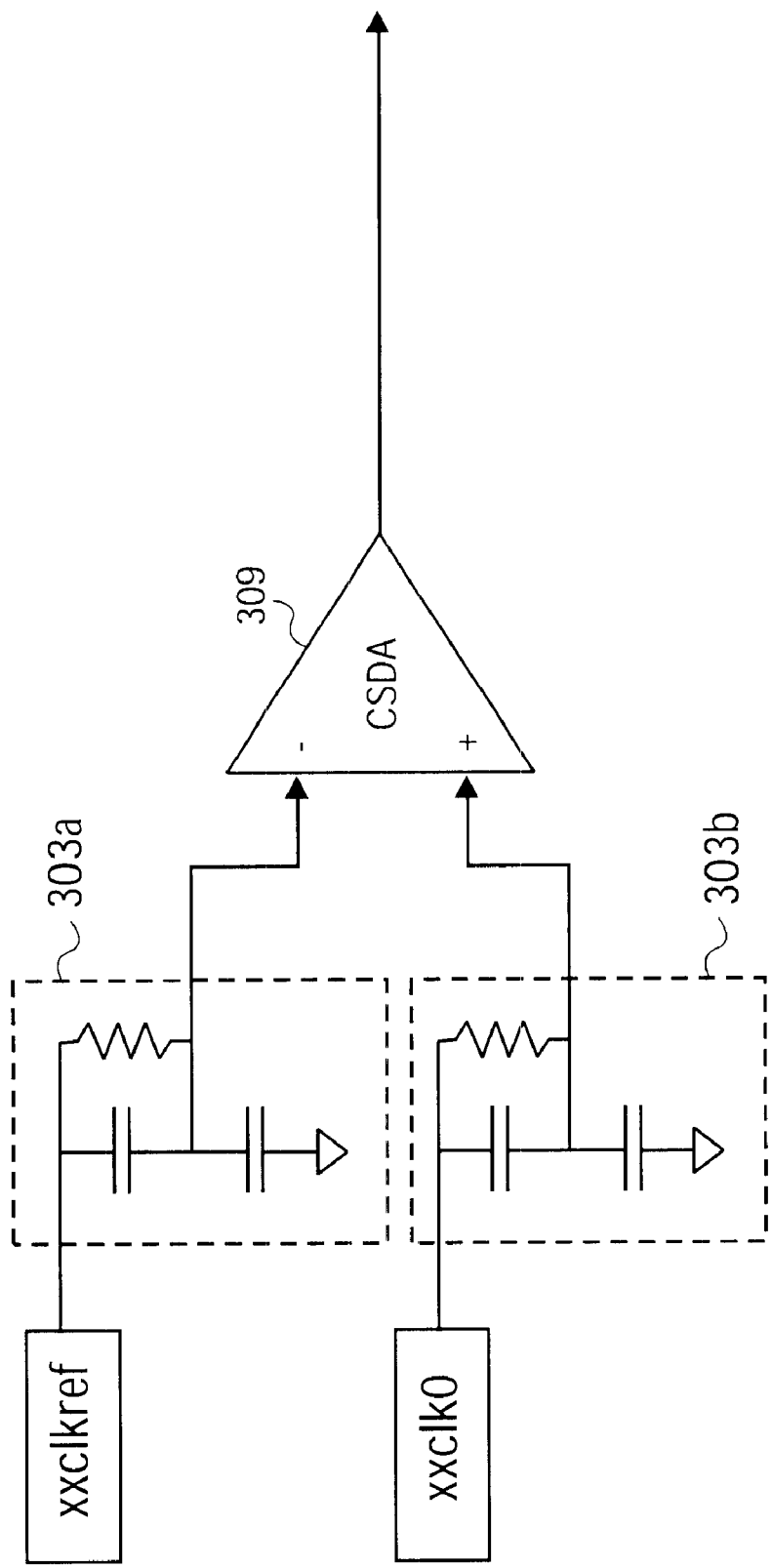
FIG. 4 is a schematic diagram of the clock input buffer of FIG. 3 when operating in low-voltage differential mode.

When differential clock signals are input, the low swing detectors 305a and 305b will attempt to detect toggling at XXCLKREF and sends full scale swing clocks to cross point counter 307. Once 16 clocks are received, cross point counter 307 will turn off the bottom resistors of the RC voltage dividers 303a and 303b, which will increase the bias point. An equivalent circuit is shown in FIG. 4. This will result in the output voltage level of the "new RC" divider raising from "$V_{ss}$ to ½ XXCLK0/XXCLKREF swing" to "¼ XXCLK0/XXCLKREF to ¾ XXCLK0/XXCLKREF swing".

In the embodiment of FIG. 2, the input level to the low swing detector 209a and second CSDA 205, while it attempts to detect the toggling clock signals, is placed as high as that in the embodiment of FIG. 3. This translates into a greater noise margin. However, the disadvantage is that it requires a special LDMOS device.

While the preferred embodiment of the invention has been illustrated and described, it will be appreciated that various changes can be made therein without parting from the spirit of scope of the invention. The current invention has been described in relation to a preferred embodiment. One of ordinary skill after reading the foregoing specification will be able to affect various changes, alterations, and substitutions or equipment without departing from the broad concepts disclosed. It is therefore intended that the scope with the Letters Patent granted hereon be limited only by the definition contained in the affirmative claims and the equivalents thereon, and not by limitations of the embodiments described herein.

What is claimed is:

1. An apparatus comprising:
   a first amplifier that receives as inputs a clock signal and a reference clock signal, said first amplifier providing a first output;
   a first VDNMOS that receives said reference clock signal and outputs a modified reference clock signal;
   a second VDNMOS that receives said clock signal and outputs a modified clock signal;
   a second amplifier that receives said modified clock signal and said modified reference clock signal, said second amplifier providing a second output;
   a low swing detector that receives said modified reference clock signal and outputs a low swing signal indicative of a low voltage swing in said modified reference clock signal;
   a controller that receives said low swing signal and outputs a control signal if said low swing signal occurs for a predetermined number of times; and
   a multiplexer that receives said first output and said second output.

2. The apparatus of claim 1 further including a second low swing detector that receives said modified clock signal.

3. The apparatus of claim 1 wherein said multiplexer receives said control signal and selectively passes said first output or said second output.

4. The apparatus of claim 1 wherein said controller comprises:
   a counter that receives said low swing signal and counts each occurrence of said low swing signal;
   a time out counter that resets said counter when said counter exceeds a predetermined number; and
   a de-glitch circuit that periodically resets said time out counter to zero.

5. The apparatus of claim 1 wherein said first and second amplifiers are differential amplifiers.

6. The apparatus of claim 1 wherein said first and second amplifiers are constant slope differential amplifiers.

7. A method comprising:
   inputting to a first amplifier a clock signal and a reference clock signal, said first amplifier providing a first output;
   inputting to a second amplifier a modified clock signal and a modified reference clock signal, said modified clock signal being said clock signal after passing through a first VDNMOS, said modified reference clock signal being said reference clock signal after passing through a second VDNMOS;
   determining if said clock signal is a low voltage differential signal or a single ended high voltage signal;
   outputting the output of said second differential amplifier if said clock signal is a low voltage differential signal; and
   outputting the output of said first differential amplifier if said clock signal is a single ended high voltage signal.

8. The method of claim 7 wherein the first and second amplifiers are constant slope differential amplifiers.

9. The method of claim 7 wherein determining if said clock signal is a low voltage differential signal or a single ended high voltage signal is done by:
   monitoring said modified reference clock signal for a low voltage swing; and
   if said low voltage swing occurs a predetermined amount of times, determining that a low voltage differential signal is present.

10. An apparatus comprising:
    a first variable voltage divider that receives a reference clock signal and outputs a modified reference clock signal;
    a second variable voltage divider that receives a clock signal and outputs a modified clock signal;
    an amplifier that receives said modified clock signal and said modified reference clock signal and provides an amplifier output;
    a low swing detector that receives said modified reference clock signal and outputs a low swing signal indicative of a low voltage swing in said modified reference clock signal; and
    a controller that receives said low swing signal and outputs a control signal to said first and second variable voltage dividers if said low swing signal occurs a predetermined number of times, said control signal causing said first and second variable voltage dividers to change their voltage dividing characteristics.

11. The apparatus of claim 10 wherein said amplifier is a differential amplifiers.

12. The apparatus of claim 10 wherein said amplifier is a constant slope differential amplifier.

13. The apparatus of claim 10 further including a second low swing detector that receives said modified clock signal.

14. The apparatus of claim 10 wherein said controller comprises:

a counter that receives said low swing signal and counts each occurrence of said low swing signal;

a time out counter that resets said counter when said counter exceeds a predetermined number; and a de-glitch circuit that periodically resets said time out counter to zero.

15. The apparatus of claim 10 wherein said first and second variable voltage dividers are RC voltage dividers.

* * * * *